(12) United States Patent
Ignomirello

(10) Patent No.: US 9,304,703 B1
(45) Date of Patent: Apr. 5, 2016

(54) METHOD AND APPARATUS FOR DENSE HYPER IO DIGITAL RETENTION

(71) Applicant: Symbolic IO Corporation, Holmdel, NJ (US)

(72) Inventor: Brian M. Ignomirello, Holmdel, NJ (US)

(73) Assignee: SYMBOLIC IO CORPORATION, Holmdel, NJ (US)

( * ) Notice: Subject to any disclaimer, the term of this patent is extended or adjusted under 35 U.S.C. 154(b) by 0 days.

(21) Appl. No.: 14/804,175

(22) Filed: Jul. 20, 2015

Related U.S. Application Data

(60) Provisional application No. 62/148,160, filed on Apr. 15, 2015.

(51) Int. Cl.
*H03M 7/00* (2006.01)
*G06F 3/06* (2006.01)

(52) U.S. Cl.
CPC .............. *G06F 3/064* (2013.01); *G06F 3/0614* (2013.01); *G06F 3/0673* (2013.01)

(58) Field of Classification Search
CPC ...... G06F 3/064; G06F 3/0614; G06F 3/0673
USPC ............................ 341/50, 51, 67, 65, 106, 55
See application file for complete search history.

(56) References Cited

U.S. PATENT DOCUMENTS

| | | | |
|---|---|---|---|
| 4,560,977 A * | 12/1985 | Murakami | ............... G06T 9/008 341/118 |
| 5,748,921 A | 5/1998 | Lambrecht et al. | |
| 5,867,180 A | 2/1999 | Katayama et al. | |
| 5,878,240 A | 3/1999 | Tomko | |
| 5,923,860 A | 7/1999 | Olarig | |
| 6,243,831 B1 | 6/2001 | Mustafa et al. | |
| 6,614,369 B1 * | 9/2003 | Widmer | ................... H03M 5/04 341/58 |
| 6,621,935 B1 * | 9/2003 | Xin | ......................... G06T 9/008 375/240.22 |
| 7,231,560 B2 | 6/2007 | Lai et al. | |
| 7,620,784 B2 | 11/2009 | Panabaker | |
| 7,822,946 B2 | 10/2010 | Sharma | |
| 7,991,941 B2 | 8/2011 | Fortin | |
| 8,078,789 B2 | 12/2011 | Hinrichs | |
| 8,589,643 B2 | 11/2013 | Meyer et al. | |
| 8,639,849 B2 | 1/2014 | Achler | |
| 2005/0288800 A1 | 12/2005 | Smith et al. | |
| 2014/0297938 A1 | 10/2014 | Puthiyedath et al. | |

OTHER PUBLICATIONS

Intel, "Intel 64 and IA-32 Architectures Optimization Reference Manual", manual, Sep. 2014, 642 pages.

(Continued)

*Primary Examiner* — Peguy Jean Pierre
(74) *Attorney, Agent, or Firm* — Maldjian Law Group LLC

(57) ABSTRACT

System and method to encode and decode raw data. The method to encode includes receiving a block of uncoded data, decomposing the block of uncoded data into a plurality of data vectors, mapping each of the plurality of data vectors to a bit marker; and storing the bit marker in a memory to produce an encoded representation of the uncoded data. Encoding may further include decomposing the block of uncoded data into default data and non-default data, and mapping only the non-default data. In some embodiments, bit markers may include a seed value and replication rule, or a fractalized pattern.

54 Claims, 3 Drawing Sheets

(56) References Cited

OTHER PUBLICATIONS

Xilinx Inc, "Virtex-5 Family Overview", Feb. 6, 2009, 13 pages.
Gilbert, "The Bus (PCI and PCI-Express)", retrieved from http://www.yale.edu/pclt/PCHW/BUS.HTM on Apr. 28, 2015 dated Jan. 4, 2008, 5 pages.
Oracle Corp, "I/O Domains and PCI Express Buses", retrieved from docs.oracle.com/cd/E1960401/8210406/configurepciexpressbuses acrossmultipleldoms/index.html on Apr. 28, 2015, 3 pages.
Hardware Secrets, "Everything You Need to Know About the PCI Express", retrieved from http://www.hardwaresecrets.com/article/EverythingYouNeedtoKnowAboutthePCIExpress/190 on Jul. 12, 2012, 3 pages.
International Computer Concepts Inc, "PCI & PCIe Overview/Comparison", retrieved from https://www.iccusa.com/comparepci/ on Apr. 28, 2015, 5 pages.

\* cited by examiner

METHOD AND APPARATUS FOR DENSE HYPER IO DIGITAL RETENTION

CROSS-REFERENCE TO RELATED APPLICATIONS

This application claims the benefit of U.S. Provisional Patent Application Ser. No. 62/148,160, filed on Apr. 15, 2015, the entire content of which is hereby incorporated by reference in its entirety.

BACKGROUND

In the early 1980s, the emergent computer industry incorporated mathematician and physicists John Von Neumann's distributed theorized compute model. Von Neumann's theories were way ahead of his time and were conceived long before the personal computing era became a reality. The Von Neumann model enabled the notion that many smaller computers could scale and produce higher computer power than a single centralized expensive computer (e.g., mainframe). As the Digital Age began, the personal computer not only became powerful but also grew in presence in homes and offices, bringing the usefulness of applications. Overtime, the personal computer (PC) out grew just being a desktop device and expanded into the data center and morphed into servers. Servers in the data center transformed into the client-server market and the well-known distributed compute model that John Von Neumann theorized forty-five years prior became reality.

For decades the PC, laptops and servers have been known to use RISC, PowerPC, ARM® and x86 architectures for processing power (CPU), limited memory (e.g., Random Access Memory RAM) and Hard Disk (HDA) devices for storage media. As the digital era continued to expand, the content computers created continued to get richer, larger in density and drove yearly innovation and upgrades in computer processing power (CPU), RAM capacities and hard drive densities. There continues to be several detriments to this approach; (1) not all components are gaining performance while gaining density [Moore's Law]; (2) the I/O interfaces of these elements are not the same speed, creating I/O bottlenecks [Kryder's Law].

A well-known upgrade technique in the computer industry has been to upgrade a computers memory (RAM) to get more performance out of a machine. Conversely, memory (RAM) capacities have been limited by several key factors, the CPU processor, nanometer density limitations of silicon, and power dissipation. By today's standards the largest memory module available is only 128 GB in capacity in contrast to the largest computer hard drive is 6 TB in capacity. In this example the hard drive is 93.75×larger than the memory module; this is the density issue. Contrariwise, the maximum input/output (I/O) transfer speed for memory modules (i.e., RAM) is currently 56.7 GB per sec, and the maximum I/O transfer speed for a Serial Attached SCSI (SAS-II) interface is currently 750 MB per sec. Thus, the memory module is 76.8× faster than today's SAS-II hard drive.

Under light computing loads, one might not notice this imbalance or battle of density vs. performance. However under a heavy computing load there is no equalizing this major imbalance of density vs. performance and I/O bottlenecks inevitably will occur. These eventually will slow the entire computing operation to the speed of the hard drive. The futile attempt to avoid this is to add more systems at the problem and rewrite applications to further distribute applications over more processor cores.

The answer to this quintessential problem would be to add more memory (RAM) and write application algorithms to alleviate the bottlenecks.

Nevertheless, the next challenge materializes, cost. Memory (RAM) in general can be very expensive depending of the density of the RAM module. A real world example of how expensive RAM is that the largest available memory module currently available is 64 GB. A single 64 GB RAM module currently sells for about $1,000.00 USD per module. The average x86 server motherboard currently sells for about $700.00 USD and can use up to 16 or 24 RAM modules. By fully populating an inexpensive x86 motherboard with 16 modules currently would cost about $16,000.00 USD; this makes RAM about 20 times more expensive than the inexpensive motherboard and would yield only 1 TB of RAM.

In an unflawed world, computers would need only memory (RAM) and high speed processors. If the challenge of density and cost did not exist, then computers without storage devices would be possible. The hurdle becomes how a memory modules (RAM) functions. All memory modules today are considered a volatile technology, meaning that when you power off a compute system, the memory losses power and the memory becomes erased. Storage device media of today do not have this issue—when the power is removed, storage device media retain the information that had been written to them. When you combine all of the factors of density, performance, cost and volatility, one can quickly deduce the reality of a computer with only CPU and RAM has been unachievable.

What is needed is an improved computing system to overcome the drawbacks the conventional art described above.

BRIEF SUMMARY

Embodiments in accordance with the present disclosure provide an inexpensive computer computing and storage apparatus that relies upon CPU and RAM, without a need for a magnetic storage device such as a conventional rotating hard drive. Embodiments provide a computing and storage apparatus and system that provides a quantum leap beyond the abovementioned obstacles surrounding computing and storage. Embodiments in accordance with the present disclosure enable a computer that may have a 57.6 GB constant I/O level that is 76.8×faster than any x86 and high performance computer in existence today.

Embodiments in accordance with the present disclosure provide a system and method to encode and decode raw data. The method to encode includes receiving a block of uncoded data, decomposing the block of uncoded data into a plurality of data vectors, mapping each of the plurality of data vectors to a bit marker; and storing the bit marker in a memory to produce an encoded representation of the uncoded data. The method to decode includes retrieving a plurality of bit markers from a memory, mapping bit markers in the plurality of bit markers to respective data vectors, combining the respective data vectors with a block of uncoded data to produce a composite uncoded data block; and producing the uncoded composite data block as the decoded data.

The preceding is a simplified summary of embodiments of the disclosure to provide an understanding of some aspects of the disclosure. This summary is neither an extensive nor exhaustive overview of the disclosure and its various embodiments. It is intended neither to identify key or critical elements of the disclosure nor to delineate the scope of the disclosure but to present selected concepts of the disclosure in a simplified form as an introduction to the more detailed description presented below. As will be appreciated, other embodiments of the disclosure are possible utilizing, alone or in combination, one or more of the features set forth above or described in detail below.

BRIEF DESCRIPTION OF THE DRAWINGS

The above and still further features and advantages of the present invention will become apparent upon consideration of the following detailed description of embodiments thereof, especially when taken in conjunction with the accompanying drawings wherein like reference numerals in the various figures are utilized to designate like components, and wherein.

Figure 1:
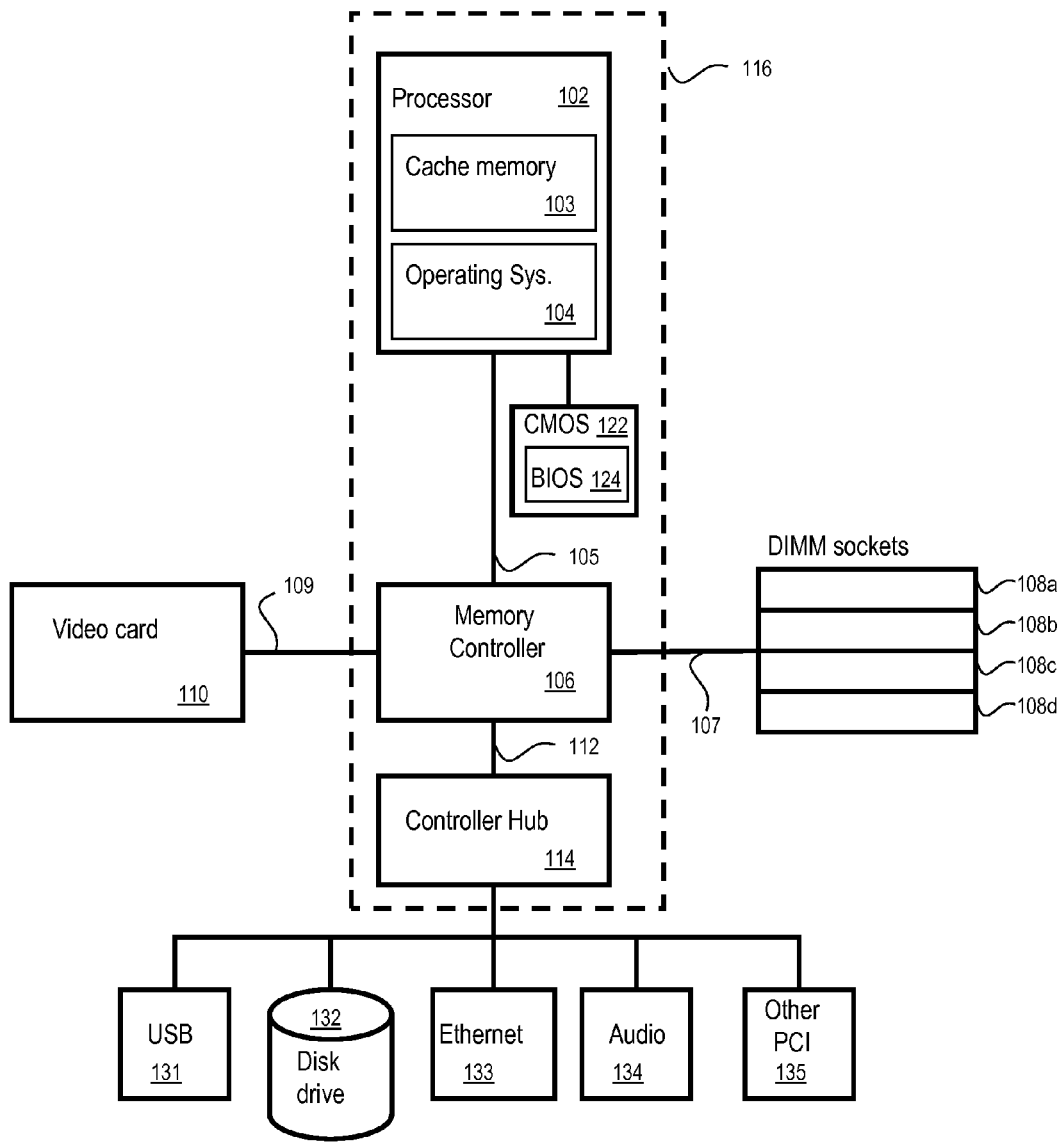
FIG. 1 illustrates a functional block diagram of a personal computer (PC) system as known in the art.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures. Optional portions of the figures may be illustrated using dashed or dotted lines, unless the context of usage indicates otherwise.

DETAILED DESCRIPTION

In the following detailed description, numerous specific details are set forth in order to provide a thorough understanding of embodiments or other examples described herein. In some instances, well-known methods, procedures, components and circuits have not been described in detail, so as not to obscure the following description. Further, the examples disclosed are for exemplary purposes only and other examples may be employed in lieu of, or in combination with, the examples disclosed. It should also be noted the examples presented herein should not be construed as limiting of the scope of embodiments of the present invention, as other equally effective examples are possible and likely.

As used herein, the term "module" refers generally to a logical sequence or association of steps, processes or components. For example, a software module may comprise a set of associated routines or subroutines within a computer program. Alternatively, a module may comprise a substantially self-contained hardware device. A module may also comprise a logical set of processes irrespective of any software or hardware implementation.

A module that performs a function also may be referred to as being configured to perform the function, e.g., a data module that receives data also may be described as being configured to receive data. Configuration to perform a function may include, for example: providing and executing computer code that performs the function; providing provisionable configuration parameters that control, limit, enable or disable capabilities of the module (e.g., setting a flag, setting permissions, setting threshold levels used at decision points, etc.); providing a physical connection, such as a jumper to select an option, or to enable/disable an option; attaching a physical communication link; enabling a wireless communication link; energizing a circuit that performs the function (e.g., providing power to a transceiver circuit in order to receive data); and so forth.

FIG. 1 illustrates a functional block diagram of a conventional computer system 100 as known in the art. System 100 may be used, for example, in a computer system based upon an Intel®-compatible architecture. As fabrication technology advances, various functional components may be fabricated in different integrated circuit (IC) configurations, depending upon factors such as generation of chipset, price-to-performance ratio of the targeted customer, targeted application (e.g., mobile devices, servers, etc.), and so forth. Certain functions may be combined into various configurations such as in a single IC, such as an IC 116.

System 100 includes a processor 102, which may be a general-purpose processor such as Xeon®, Intel Core i7®, i5®, i3®, or processors from Advanced Micro Devices® (AMD) such as Athlon64®, and the like. In other embodiments, processor 102 may be a graphics processing unit (GPU). In the functional block diagram of FIG. 1, processor 102 as used herein may refer to the functions of a processor, and/or refer to the one or more hardware cores of a processor. Processor 102 may include multiple processing cores that operate at multi-GHz speeds. Processor 102 may include a cache memory 103 (e.g., L1 or L2 cache). Processor 102 also may be programmed or configured to include an operating system 104. Examples of operating system 104 include various versions of Windows®, Mac OS®, Linux®, and/or operating systems or operating system extensions in accordance with an embodiment of the present disclosure, and so forth. The registered trademark Windows is a trademark of Microsoft Inc. The registered trademark Mac OS is a trademark of Apple Inc. The registered trademark Linux is used pursuant to a sublicense from LMI, the exclusive licensee of Linus Torvalds, owner of the mark on a world-wide basis. Operating system 104 performs conventional functions that include the running of an application program (not shown in FIG. 1). Functionally, operating system 104 is illustrated as being a part of processor 102, but portions of operating system 104 may physically reside in a non-volatile memory (e.g., a hard disk), not illustrated in FIG. 1, and at least portions of operating system 104 may be read into RAM memory as needed for execution by processor 102.

Processor 102 may use several internal and external buses to interface with a variety of functional components. System 100 includes communication bus 105 that links processor 102 to memory controller 106. Memory controller 106 may also be referred to as a northbridge. Communication bus 105 may be implemented as one of a front side bus (FSB), a Non-uniform memory access (NUMA) bus, an EV6 bus, a Peripheral Component Interconnect (PCI) bus, and so forth.

System 100 further includes a nonvolatile memory 122 (e.g., a CMOS memory) coupled to processor 102. CMOS memory 122 may include a basic input/output system (BIOS) 124, which helps manage low-level communication among computer components, and may include storage of computer code to perform a power-on self-test. Conventionally, a power-on self-test may include a test of the data integrity of installed RAM.

Memory controller hub 106 typically handles communications between processor 102 and various high-speed functional components such as external RAM memory installed in dual in-line memory module (DIMM) slots 108a, 108b via communication bus 107, and video graphics card 110 via communication bus 109. Communication buses 107 and 109 may be high-speed interfaces, such as Peripheral Component Interconnect Express (PCIe) or Accelerated Graphics Port (AGP). Memory controller hub 106 may also handle communications between processor 102 and controller hub 114, via communication bus 112. Controller hub 114 may also be known by other names such as a southbridge, an I/O Controller Hub (ICH), a Fusion Controller Hub (FCH), a Platform Controller Hub (PCH), and so forth. Controller hub 114 in turn manages further communication with additional and/or slower I/O devices or interfaces such as USB ports 131, disk drives 132 with standard interfaces (e.g., ATA/SATA, mSATA, SAS, etc.), Ethernet transceivers 133, audio ports 134, other PCI devices 135, and so forth.

In some configurations of system 100 (not illustrated), processor 102 is designed to bypass memory controller 106 and communicate directly with controller hub 114 via a Direct Media Interface (DMI). Such configurations also may integrate the functions of processor 102 and memory controller 106 into a single IC 116. In such configurations, controller hub 114 is typically a Platform Controller Hub (PCH).

Although the memory chips that make up RAM memory installed in DIMM slots 108a, 108b may have a very high maximum access speed (e.g., about 57 GBytes/sec), communication bus 109 normally cannot support such fast speeds. For example, the speed of PCIe 4.0 in a 16-lane slot is limited to 31.508 GBytes/sec. AGP is slower still than PCIe. Therefore, communication bus 107 is a bottleneck that prevents faster memory access.

The bottleneck of memory access is one drawback of the conventional art. Other drawbacks described above of a conventional computer include the mismatch in storage size between the size of RAM memory (typically on the order of a few Gbytes) and the storage size of a conventional hard disk (typically on the order of a few Tbytes), and the relatively small storage size of RAM memory to the storage size of a conventional hard disk. Another drawback of the conventional art is the volatile nature of the RAM memory.

Embodiments in accordance with the present disclosure break the density issue that RAM has today. Embodiments in accordance with the present disclosure address these drawbacks of the conventional art by providing a novel hardware interface for storage units, and a novel driver interface for the hardware interface.

Outside of the CPU, RAM is the fastest element in x86 and x64 computing systems, so embodiments allows for the alignment of today's high speed RAM performance with a new method of gaining density. As this effect is applied, it completely changes the cost paradigm and allows low cost memory modules to replace the need for high-density, high cost memory modules.

A remaining issue is the volatility of standard memory modules. Since all RAM is volatile, it does not lend itself to becoming a long-term storage medium. Embodiments are similar to but differ from non-volatile RAM (NVRAM) technology, which circumvents the volatility issue found in standard DIMM devices.

Embodiments in accordance with the present disclosure use a basic inexpensive x64 motherboard that can be powered by Intel® or AMD® CPU processors. The motherboard has a modified CME and BIOS that gives it the intelligence required to be Non-Volatile Memory aware. In addition, the motherboard provides to each memory module a DC supply voltage (e.g., 1.2 v, 1.35 v, 1.5 v, etc.) that may be used to charge environmentally-safe low-load, slow-drain capacitors. This design allows for shutdown state (e.g., loss of power or safe shutdown) to maintain data persistence within the memory module, thus making the memory module a viable long-term storage device.

Figure 2:
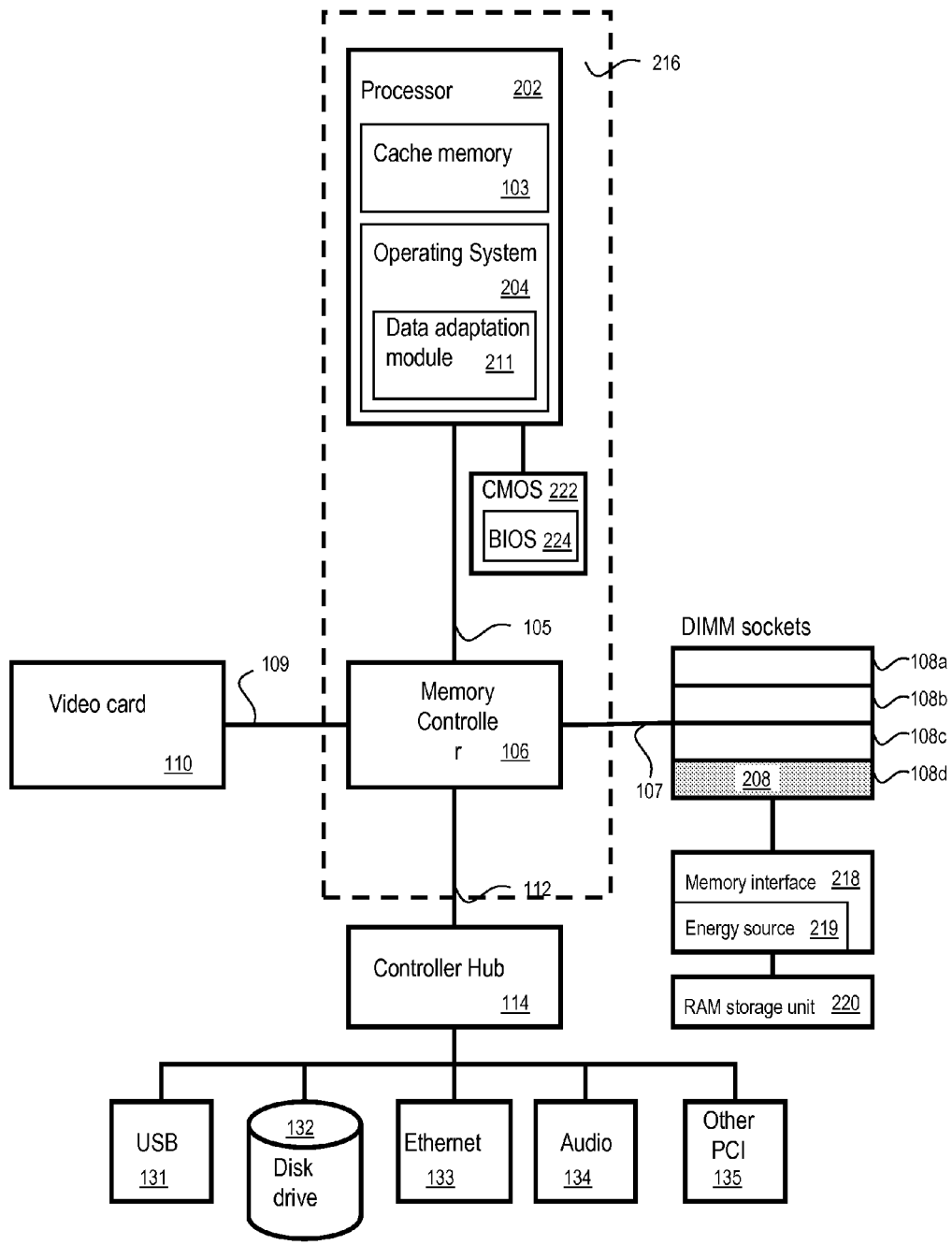
FIG. 2 illustrates a functional block diagram of a PC system in accordance with an embodiment of the present disclosure.

FIG. 2 illustrates a functional block diagram of a computer system 200 in accordance with an embodiment of the present disclosure. Functional components already described in FIG. 1 are assigned in FIG. 2 the same reference number as that shown in FIG. 1. System 200 includes a memory interface 218, which may be physically coupled to a DIMM slot (e.g., DIMM slot 108b) by use of a connector 208 such as a Molex® connector. Memory interface 218 communicates with processor 202 through DIMM slot 108b by use of conventional protocols on communication bus 107. Memory interface 218 is coupled physically and communicatively to RAM storage unit 220. Functions of memory interface 218 include communicatively coupling RAM storage unit 220 to communication bus 107, monitoring for certain events like state of health related to RAM storage unit 220, other hardware events, taking certain actions based upon detected signals or hardware events, and so forth. Functions of memory interface 218 also may include simple processing and housekeeping functions such as resolving memory addresses, reporting memory size, I/O control, keeping track of and reporting total power cycles, run time in an hour, reporting number of DIMMs, reporting status such as ultra capacitor (cap) current voltage, bus ready, last restore success or failure, device ready, flash status of the NAND area, cap connected, cap charge status, valid image present, DIMM init performed, read registers, and so forth. NAND may be known as a type of non-volatile IC-based storage technology that does not require power to retain data.

System 200 further includes a nonvolatile memory 222 (e.g., a CMOS memory) coupled to processor 202. CMOS memory 222 may include a basic input/output system (BIOS) 224, which helps manage low-level communication among computer components, and may include storage of computer code to perform a power-on self-test. Conventionally, a power-on self-test may include a test of the data integrity of installed RAM. Embodiments in accordance with the present disclosure may include a modified power-on self-test (as compared to the power-on self-test of BIOS 124), such that the power-on self-test may skip the test for at least some predetermined memory modules, e.g., if the test would be incompatible with the nature of data stored in the predetermined memory module.

Embodiments in accordance with the present disclosure also address the RAM volatility shortcoming of the known art by coupling an energy source 219 with RAM storage unit 220. Energy source 219 may be incorporated with memory interface 218. Energy source 219 is a source of backup power, such that if an external power supply to RAM storage unit 220 is lost (e.g., by way of an AC power failure affecting the entire computing system 200, removal of a battery powering a mobile system 200, motherboard failure, etc.), energy source 219 may provide sufficient power in order to maintain integrity of data stored in RAM storage unit 220.

A destage process involves transferring data among physical media. Embodiments in accordance with the present disclosure implement a destage process by use of both hardware and software components. Hardware components include connector 208, memory interface 218, energy source 219 and RAM storage unit 220. Connector 208 may include a predetermined pin used to supply operating power to memory interface 218. Memory interface 218 may include limited processing power (e.g., a small CPU) to manage detection and notification processes such as for charging status of energy source 219, anomaly detection, and for LED lights (e.g., green, yellow, red). If a power loss is indicated, a switch may be activated to initiate a transfer to protected storage of data in memory interface 218 critical to system operation (e.g., configuration information, system state, etc.). Once destaging is complete, memory interface 218 may enter a reduced-power mode, and/or power off. Power for performing the destaging process may be supplied at least in part by energy source 219. Data integrity will be maintained by use of power from energy source 219.

If connector 208 is removed from its respective DIMM slot 108, connector 208 and/or memory interface 218 may include features to help ensure that if/when connector 208 is removed from a predetermined DIMM slot 108, that connector 208 when reinserted will be reinserted into the same respective DIMM slot 108. These features may act as security features, such that if incorrect reinsertion occurs, bits stored effectively will be scrambled and rendered unreadable.

Embodiments in accordance with the present disclosure also provide a restoration procedure. The restoration procedure is usable for recovery from a complete system failure or power loss. For example, if a motherboard fails, embodiments enter a low-power mode and repairs of the system (e.g., a motherboard replacement) or salvaging of components (e.g., removing of connector 208, memory interface 218, energy source 219 and RAM storage unit 220 for placement in a new unit). The restoration process includes re-installing memory modules into the same respective slot locations that they occupied in the defective unit. Memory modules may include physical or logical keying such that the memory modules will be unusable if installed in different slot locations within the replacement unit. For example, memory modules installed in different slot locations may produce scrambled bits (i.e., "bit scrambling") if an attempt is made to read data from memory modules so inserted. The signature is associated with the module in the slot. So, for example, if you had a memory module originally installed in the B1 slot, and tried to reinstall it into the E1 slot, or vice versa, then the machine would not start. Data modules are matched to a slot number. A rationale for a hard association between memory modules and slot numbers is that attempting to restore data with memory modules installed in the wrong slots may destroy data, so embodiments detect a wrong slot condition and prevent data access.

Backup and restoration procedures may be implemented by way of a module API (i.e., "chip calls"). API functions may include backup and restore. API functions may be triggered upon occurrence of certain predetermined events, e.g., an "on-trigger" API call. For example, an application program may include a checkpoint, at which the system checks for an occurrence of a condition or an event that may pose a risk to the data. Upon such a detection, a backup API may be triggered, which may copy certain critical data, configuration information, metadata, etc., into a protected and nonvolatile memory such as a NAND memory. Examples of events that may trigger a backup include initiation of a boot process, recovery from a hardware or software fault, and so forth.

At system initialization, circuit power is supplied and the system components receive power. Energy source 219 will begin to recharge. Status indicators (e.g., LEDs of various colors such as green, yellow, red, etc.) may be provided for the visual benefit of users. Status indicators may indicate progress at a first stage (e.g., performing a checksum). If a problem may be indicated, embodiments pay proceed to an alternate and/or more comprehensive procedure, e.g., checking the data image to carefully compare every bit and byte. Using conventional methods, this may be a very slow due to NAND speed limits, e.g., a ten-minute boot. Fault conditions may be detected and cause a system halt, module missing, module mismatch, etc. As noted earlier, if memory interface 218 and RAM storage unit 220 are not replaced correctly (e.g., wrong slot or wrong order), or are installed on a wrong system (i.e., one without required bitmarkers), data cannot be recovered. This behavior is needed in order to provide heavy security. A separate indicator may indicate when an API function is complete.

Voltage and power flow (e.g., 1.2 v, 1.35 v, 1.5 v, etc.) is applied through connector 208 to a designated DIMM pin or alternate element, which in turn under normal operation energizes energy source 219. Thermal design of memory interface 218 may include an element to cool energy source 219, e.g., by use of a heat sink.

Energy source 219 may have sufficient energy to maintain data integrity for a period of time of at least several months. Energy source 219 may be a large-capacitance capacitor known as a "super cap", e.g., at least 600 Farads. Alternatively, energy source 219 may be a battery. However, a battery-based energy source such as a lithium battery is prone to catastrophic failure (e.g., arcing, fire) if damaged or in an internal short-circuit develops. Energy source 219 may be continuously charged under normal conditions by the main power to system 200 when energy source 219 is not supplying power to RAM storage unit 220.

System state may be restored, so long as system state is stored in RAM storage unit 220. In some embodiments, a separate backup energy source also may provide energy to other portions of a computing system (e.g., a processor and cache), such that a system state or other additional states may be preserved during a power outage. When the external power supply is restored, the computing system may be restarted or restored from a persistent or stateful state. In some embodiments, the system may enter or exist in a state of reduced power consumption while system state is preserved by the backup energy source.

Functions of memory interface 218 may further include monitoring a state of health of energy source 219, e.g., a voltage level since voltage levels may decay over time or in advance of a failure. Such a state of health may be communicated back to a monitoring system via communication bus 107. Memory interface 218 and RAM storage unit 220 may operate without requiring modification to cache memory 103.

System 200 further includes operating system 204, which is adapted to store and retrieve data to/from RAM storage unit 220. Operating system 204 includes data adaptation module 211 as part of a novel driver interface. Data adaptation module 211 executes bit generator software, which provides the functions of data adaptation module 211 described herein. The bit generation software may be loaded in real-time during the initialization process of processor 202. Conventional RAM memory (e.g., memory coupled to DIMM slot 108a) and/or cache memory 103 may be used to support functions of data adaptation module 211. When storing data, data adaptation module 211 adapts data to be stored in RAM storage unit 220 by encoding raw data into encoded data, and then storing the encoded data into RAM storage unit 220. Typically, for raw data of a predetermined size (i.e., a predetermined number of raw data bits), the encoded data is smaller, i.e., the encoded data may be represented by a smaller number of encoded data bits than the number of raw data bits. Data adaptation module 211 may store into RAM storage unit 220 an amount of data that, if represented in its raw form, would exceed the storage capacity of RAM storage unit 220. An effective storage capacity of RAM storage unit 220, e.g., as measured by an equivalent number of raw data bits, may exceed a physical storage capacity of RAM storage unit 220. Processor 202 may utilize conventional RAM memory and/or cache memory 103 in order to support operation of processor 202 for conventional functions, e.g., as a server.

The transfer of encoded data by data adaptation module 211 into RAM storage unit 220 may take place at a transfer rate that, if represented by the transfer of the equivalent raw data bits, would exceed the maximum data transfer rate of the processor, RAM storage unit 220, and the communication bus linking the processor to RAM storage unit 220.

Similarly, when retrieving stored data from RAM storage unit 220, data adaptation module 211 adapts data read from RAM storage unit 220 by decoding encoded data into raw data, and then providing the raw data for other uses, e.g., by processor 202 or application programs running on processor 202.

Data adaptation module 211 adapts the data at a sufficiently high speed such that resources spent encoding data (e.g., processing time by processor 202) is less than the resources saved (e.g., transmission time on communication bus 107) by transmission of encoded data rather than raw data to RAM storage unit 220. Similarly, the processing time spent decoding data is less than the time saving resulting from transmission of encoded data rather than raw data from RAM storage unit 220.

Embodiments in accordance with the present disclosure, when in production, may run a specialized thin OS in data adaptation module 211 that enables the platform to be a hybrid compute and storage system. The OS will also offer an embedded server virtualization platform to allow several virtual machines to run simultaneously on the platform. One of many examples of these would be a single system running ten to fifteen or more Microsoft Windows instances independently and simultaneously, all without ever experiencing an I/O lag that otherwise would be inherent to conventional known virtual compute platforms.

Embodiments in accordance with the present disclosure may also be used when running extreme high-performance transaction processing found in complex database systems. Such applications enable the possibility of running a large portion of, or the entirety of, the system database purely in RAM.

Preliminary testing and/or simulation of embodiments indicate that a properly configured system could achieve upwards of 4 TB of extreme high speed RAM storage with as little 48 GB of NVRAM.

Processes to encode raw data, and to decode processed data to produce raw data, as described herein may be performed by invoking modules within data adaptation module 211. These modules may be invoked by operating system 204, or another application program executing on processor 202.

One embodiment of encoding of raw data is described in U.S. Patent Application Publication No. 2014/0223118 to Ignomirello ("the '118 Publication"), which is commonly assigned with the present application, and the entire content of which is hereby incorporated by reference.

Other embodiments may encode raw data by use of a Bit marker method, such as described in the '118 Publication, which enables the effective storage capacity of RAM storage unit 220 to become more elastic, and allowing the effective storage capacity and density to grow very quickly. Storage capacity may be elastic in the sense that an equivalent amount of raw data that can be stored is not a fixed value, but may change depending upon characteristics of the raw data, e.g., how well the raw data matches to the Bit markers. The raw data capacity is not controlled or known in advance by the operating system or by lower-level software such as the basic input/output system (BIOS). Embodiments may reduce the need for RAM chips of very high physical capacity, and concomitant very dense nanometer feature design, thus allowing for usage of lower-density and/or older generations of RAM chips for RAM storage unit 220.

A Bit marker may be derived from, or based at least in part from, a characteristic of the raw data, or a characteristic derived from the raw data. The characteristic of the raw data may be, for example, the type of raw data (e.g., an audio file, a graphics file, a video file, a ZIP file, a Word file, a PDF, etc.), a file format (e.g., for graphics files, bitmapped, GIF, TIF, JPEG, etc.), content of the file (e.g., for an MP3 audio file, whether it is an MP3 of classical music, jazz, rap, rock music, spoken words such as an audio book, etc.), attributes of the file (e.g., for an MP3 audio file, the bit rate, mono or stereo, metadata, total length, encoder used, dynamic range, time length, etc.), statistics of the file (e.g., size, age, date modified, probability distribution of bytes or sequences of bytes within the file, etc.), and so forth. For example, an MP3 file may contain certain raw data bits (i.e., sequences of bytes) more often than a different type of file (e.g., a JPG file), therefore knowledge that a file is an MP3 file may affect the Bit markers selected and the raw data bits that each Bit marker represents. Data adaptation module 211 may adaptively change, over time or over amount of raw data processed, the Bit markers used to represent the raw data in response to changes in characteristics of the raw data, e.g., if the characteristics of the raw data become better known or are not stationary in a statistical sense.

A Bit marker may represent a vector of raw data, i.e., a predetermined sequence of raw data bits. The vector of raw data also may be referred to as a data segment. Different Bit markers may represent vectors of different length. Raw data may be decomposed into vectors of raw data, and the vectors then mapped to a Bit marker. In some embodiments, concatenated vectors may represent the raw data. In other embodiments, vectors may overlap such that a combination of vectors (e.g., Boolean AND, OR, XOR, NAND, etc.) may represent the raw data. The raw data may be represented by a plurality of layers (e.g., for a graphics file, separate layers for each color component such: as R, G, B; or C, Y, M, K; or other logical layers, etc.), and Bit markers may be used to represent separately raw data bits within each color layer. In some embodiments, the raw data may be represented as a multidimensional data structure (e.g., a 2-D array, a 3-D cube, an N-dimensional structure, etc.), and a vector may represent a contiguous portion of the multidimensional data structure (e.g., a rectangular portion of a 2-D array of raw data). A bit marker may be viewed as a translational function that translates between a vector pointer and the raw vector data itself.

In some embodiments, knowledge of a Bit marker (e.g., the characteristic derived from the raw data), may be sufficient to generate model vectors to match to the raw data. For example, suppose that a set of raw bits (e.g., a file or information received from a communication link) represent video streaming media. It may be surmised, deduced, or otherwise configured that the raw bits represent video streaming media having particular characteristics (e.g., frame rate, resolution, pixel dimensions, color palette, etc.), and a Bit marker may be selected to indicate that the data is video streaming media of those characteristics. Knowledge that the Bit marker represents video streaming media of those characteristics may be used to generate model vectors predictively matched to the characteristics of video streaming media, e.g., frame rate, resolution, pixel dimensions, color palette, etc. A benefit of such an embodiment is that once the Bit marker is known, encoding can be accomplished on the fly, e.g., by processing streaming media in real time. For the processing a file (e.g., an MP3 file, a DVD video disk, etc.), the processing may be accomplished without needing to read in the entire file (e.g., on a section-by-section basis), and needing only a buffer of a relatively modest size. Encoded data may be stored to RAM storage unit 220 as it is produced.

In some embodiments, an object may be a compound object, i.e., an object of one file type and yet encompass another file type. For example, an email object may include within it an embedded object such as an attached PDF, an attached ZIP file, an attached Word document, another email object, etc. Knowledge that an object is a compound object may be useful to help select vectors and Bit markers appropriate for the embedded type of object, and for separate portions of the compound object.

In some embodiments, raw data may be converted from a one-dimensional structure to a multidimensional structure by analyzing the raw data to determine useful boundaries between various sections prior to partitioning. The various sections after partitioning form the multidimensional structure. In some embodiments, the analysis may take into account available processor cache size, e.g., in order to help ensure that the analysis can be performed quickly.

In some embodiments, a Bit marker may represent a nucleus (i.e., a relatively small set of seed raw data bits, a starting value, a starting pattern, etc.) together with a replication rule for how to produce additional data from the seed, e.g., to expand the nucleus to an arbitrarily large number of raw data bits. The rule for producing additional data may include, e.g., replication a predetermined number of times or to a predetermined length, a fractal-based replication, run length replication, and so forth. Such a representation may be useful for a fractal-based mapping of raw data bits to a fractal pattern rendered at a particular size, for example, if a portion of a 2-D multidimensional raw data structure could be represented by a fractal pattern. As used by embodiments, fractal patterns for data encoding and decoding may exist for raw data in other dimensionality, e.g., 1-D (a linear pattern), 3-D, and so forth.

In some embodiments, a Bit marker may represent one or more DNA submarkers, together with a rule for combining the DNA submarkers. For example, a Bit marker may represent a vector $V_4$ concatenated with the XOR product of $V_3$ and $V_1$. The resulting Bit marker then may act as a submarker for combining with other submarkers to form another marker.

Initially, vectors and their corresponding Bit markers may be stored in a vector field. The vector field is normally stored in a separate memory, apart from RAM storage unit 220. For example, if RAM storage unit 220 is coupled to DIMM socket 108b, then the vector field may be stored in a conventional DIMM memory coupled to DIMM socket 108a, or in cache memory 103, and so forth. A group of raw data bits may be transmitted to data adaptation module 211, which then maps or correlates the raw data bits or a portion thereof to vectors in the vector field. Corresponding Bit markers then may be retrieved from the vector field and stored in RAM storage unit 220 in place of the equivalent raw data bits. Bit markers may be reused or "amplified", such that if the raw data includes multiple instances of raw data bits, the corresponding Bit marker may be stored in RAM storage unit 220 with an indication that it is used for the multiple instances of raw data bytes. Amplification refers to a ratio between the size of a bit marker (e.g., as measured by the number of bits or bytes) and the size of the equivalent raw data bits (or bytes) replaced by instances of the usage of the bit marker.

In some embodiments, RAM storage unit 220 may be logically partitioned, such that one portion of RAM storage unit 220 (e.g., one physically addressable portion) may store Bit markers, while another portion of RAM storage unit 220 may operate as traditional memory. In some embodiments, RAM storage unit 220 coupled to one of the DIMM slots (e.g., DIMM slot 108b) may operate to store Bit markers, and a RAM module coupled to another DIMM slot (e.g., DIMM slot 108a) may operate as conventional memory.

Other embodiments in accordance with the present disclosure include a bit generator which encodes long form data into short form bit Markers during data population and decodes short form bit Markers into long form data on the fly when requested.

In some embodiments, one or more patterns may be discerned in a set of raw data. The pattern may be, for example, a periodicity in the raw bits when the raw bits are expressed as a linear series of "0" and "1". Patterns may also be in the form of a periodicity in the raw data when the raw data is expressed as a linear series of bytes, or a multidimensional periodicity when the raw data is expressed as a multidimensional set of raw data. The periodicity may be expressed as a frequency of a predetermined pattern in the raw data. Characteristics of the periodicity may include a frequency and a phase. Multidimensional data may be characterized independently in each dimension. A period (or conversely a frequency) may be expressed as raw bits per repeating cycle of the predetermined pattern, e.g., 256 bits per cycle, 65,536 bits per cycle, etc. A phase may indicate a starting point of the pattern with respect to a reference copy of the predetermined pattern (e.g., a dictionary copy). Embodiments may use the frequency and phase characteristics as identifying characteristics (e.g., a Bit marker, a fingerprint, etc.).

In some embodiments, a periodicity in a one-dimensional raw data may be modeled or analyzed as a multidimensional raw data. For example, a data trace representing an electrocardiogram includes an inherent periodicity represented by the heartbeat rate. The periodicity is not perfect, because the frequency (e.g., beats per minute) may change over time, and the exact shape of the electrocardiogram may change from one beat to another. Nevertheless, the electrocardiogram trace may be modeled as a multidimensional structure, with the electrocardiogram for one beat (e.g., a first beat, or a reference beat, or an ideal beat, etc.) representing one plane (i.e., two axes) of voltage versus time, and a third dimension representing ordinal beat number. Data may be encoded in part by analyzing the differences in the third dimension, after accounting for changes in factors such as frequency noted above.

In some embodiments, the pattern may represent a linear combination of one or more basis functions or basis vectors. In mathematics, a basis function is an element of a particular basis for a function space. Every continuous function in the function space can be represented as a linear combination of basis functions. Similarly, every vector in a vector space can be represented as a linear combination of basis vectors. Basis vectors are known as a set of linearly independent vectors in a vector space, and every other vector in the vector space is linearly dependent on these vectors.

For example, the raw data may be decomposed into a combination of basis vectors. Each basis vector is a measurable binary pattern. Preferably, a basis vector should be very long compared to a Bit marker (i.e., a pointer to a basis vector in a vector map) used to reference the basis vector, but the basis vector may be shorter than the entire raw data. The representation of raw data as basis vectors may include one or more data pairs of (a) a Bit marker for a basis vector and (b) a starting position in the raw data of the basis vector. A gene pool is related to the vector map, in that the gene pool may include information regarding how to reconstruct raw data from vectors. For example, a gene pool may indicate a type of file to be reconstructed (e.g., an MP3 file), knowledge of which would be useful in reconstructing the file. Analogizing to a jigsaw puzzle, vectors may represent individual pieces of a jigsaw puzzle, and a gene pool may represent a photo that the entire jigsaw puzzle should look like when completed.

In some embodiments, raw data not represented by a basis vector may be deemed to be a predetermined value, e.g., a 0x00 or 0xFF byte. This may be useful if the raw data has a large number of consecutive bits or bytes of the predetermined value, e.g., a large number of consecutive 0x00 bytes.

In some embodiments, raw data may be decomposed into basis vectors that may at least partially overlap. Overlapping basis vectors may be combined by default as a Boolean OR, but other Boolean functions may be used (e.g., AND, XOR, NAND, etc.).

In some embodiments, the vector dictionary may be adaptive to changes in statistics of the raw data. For example, if the type of information being stored changes (e.g., from video to MP3), the statistics of the raw data may also change. Such changes may mean that certain basis vectors are used less often, and other basis vectors may be used more often. Embodiments may recognize changes in usage and update a basis dictionary appropriately, e.g., by culling some basis vectors and adding other basis vectors. The decoder will be aware of changes in the vector dictionary, e.g., by inclusion of a dictionary update.

In some embodiments, entries in the vector dictionary may have different, but fixed lengths. The lengths may depend upon statistics of the raw data. For example, Bit markers may have different lengths, such that Bit markers corresponding to more commonly-occurring vectors in the raw data may be shorter (i.e., the Bit marker comprises fewer bits) than Bit markers corresponding to less commonly-occurring vectors in the raw data. Alternatively, Bit markers may have equal lengths, but some Bit markers may correspond to a longer but more commonly-occurring vector of raw data than other Bit markers that represent shorter but less commonly-occurring vector of raw data.

In some embodiments, Bit markers may be represented in a tree and leaf paradigm, which may be inherently hierarchical. In this paradigm, each Bit marker is represented by a leaf, with a size and/or position of the leaf in the tree corresponding to a characteristic of the Bit marker it represents. For example, a more commonly-occurring Bit marker may be represented as a smaller leaf or a leaf closer to the root of the tree. Conversely, a less commonly-occurring Bit marker may be represented as a larger leaf or a leaf farther from the root of the tree. The goal may be to use leaves that are as small as possible, or to use leaves as close to the root as possible, or to use leaves that tend to minimize a mathematical function, such as a product of the size of the leaf times the number of times that the leaf is used.

Decoding data involves reading encoded data from RAM storage unit 220, and then performing functions to reverse the encoding processes. Decoding functions may be provided by modules within data adaptation module 211. For example, to restore data, a block of encoded data may be read from RAM storage unit 220. The block of encoded data may be temporarily stored in a high speed memory while decoding processes are performed. Decoding processes are provided by modules within data adaptation module 211. These modules may be called by operating system 204.

More particularly, when retrieving data from RAM storage unit 220 and decoding it, data adaptation module 211 adapts data to be stored in RAM storage unit 220 by decoding raw data into decoded data. Conventional RAM memory (e.g., memory coupled to DIMM slot 108a) and/or cache memory 103 may be used to support decoding functions of data adaptation module 211.

Figure 3A:
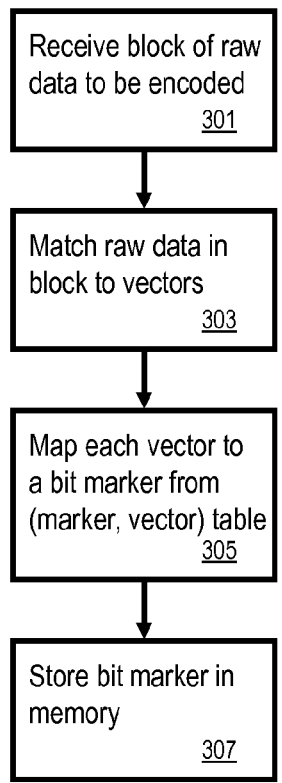
FIG. 3A illustrates a method to encode data in accordance with an embodiment of the present disclosure.

FIG. 3A illustrates an encoding process 300 in accordance with an embodiment of the present disclosure. Process 300 may be performed by operating system 204 and data adaptation module 211.

Process 300 begins at step 301, at which a block of raw data to be stored is received from an application program that intends to store the raw data. The raw data may be in the form of a file, a streaming media, a fixed-size or variable-size block of data, and so forth.

Next, process 300 transitions to step 303, at which portions of the raw data received in step 301 may be mapped or matched to candidate vectors of raw data. The candidate vectors may be stored as a table of (marker, vector) pairs in conventional memory. The goal is to represent each bit or byte in the raw data by at least one vector. Certain raw data bytes such as 0x00 or 0xFF may be deemed to be a default value, and for any raw data bytes equal to the default value, it is optional to represent the default bytes with a vector.

Next, process 300 transitions to step 305, at which vectors determined in step 303 may be mapped to a respective bit marker from the table of (marker, vector) pairs. The bit marker is a short way to refer to the associated vector.

Next, process 300 transitions to step 307, at which the bit marker from the table of (marker, vector) pairs is stored in memory, such as RAM storage unit 220.

Figure 3B:
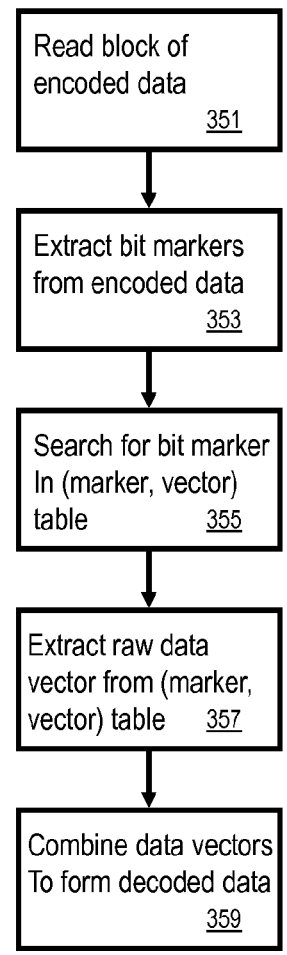
FIG. 3B illustrates a method to decode data in accordance with an embodiment of the present disclosure.

FIG. 3B illustrates a decoding process 350 in accordance with an embodiment of the present disclosure. Process 350 may be performed by operating system 204 and data adaptation module 211.

Process 350 begins at step 351, at which a block of encoded data to be decoded is read from a memory, such as RAM storage unit 220. Addresses may be managed by virtual address adjustment methods and tables, as known to persons of skill in the art.

Next, process 350 transitions to step 353, at which bit markers are extracted from the encoded data.

Next, process 350 transitions to step 355, at which the extracted bit markers from step 353 are searched for in the table of (marker, vector) pairs.

Next, process 350 transitions to step 357, at which a raw data vector is extracted from an entry in the table of (marker, vector) pairs, corresponding to the extracted bit marker from step 353.

Next, process 350 transitions to step 359, at which the extracted raw data vectors from step 357 are combined to form reconstructed decoded data. If the combined raw data vectors do not cover all addresses within an entire expected address range of the reconstructed decoded data, the uncovered addresses may be deemed to take on a default value in the decoded data, e.g., 0x00 or 0xFF bytes.

When analyzing the I/O capability, conventional systems may allow for continuous I/O speeds up to 57.6 GB per second. In contrast, for a system in accordance with an embodiment of the present disclosure, the system tested with Intel Ivy Bridge 2697 v2 processors, embodiments may have 24 physical process cores and up to 40 hyper threaded cores, 6144 KB of L2 processor cache, 60 MB of L3 processor cache all at 5.4 GHz with a boost capability of 7.6 GHz. Comparing performance of the embodiments vs. any other Ivy Bridge 2697 v2 server shows an I/O increase of 76.8×faster. Commensurate performance gains are achievable with other computing environments, including Haswell motherboard architectures and DDR4 memory.

While the foregoing is directed to embodiments of the present invention, other and further embodiments of the present invention may be devised without departing from the basic scope thereof. It is understood that various embodiments described herein may be utilized in combination with any other embodiment described, without departing from the scope contained herein. Further, the foregoing description is not intended to be exhaustive or to limit the invention to the precise form disclosed. Modifications and variations are possible in light of the above teachings or may be acquired from practice of the invention. Certain exemplary embodiments may be identified by use of an open-ended list that includes wording to indicate that the list items are representative of the embodiments and that the list is not intended to represent a closed list exclusive of further embodiments. Such wording may include "e.g.," "etc.," "such as," "for example," "and so forth," "and the like," etc., and other wording as will be apparent from the surrounding context.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/ or other categories of items.

Moreover, the claims should not be read as limited to the described order or elements unless stated to that effect. In addition, use of the term "means" in any claim is intended to invoke 35 U.S.C. §112, ¶6, and any claim without the word "means" is not so intended.

I claim:

1. An encoding method, comprising:
   receiving a block of uncoded data;
   decomposing the block of uncoded data into a plurality of data vectors;
   deriving a bit marker from a characteristic of the uncoded data;
   mapping each of the plurality of data vectors to a respective derived bit marker; and
   storing the derived bit marker in a memory to produce an encoded representation of the uncoded data.

2. The encoding method of claim 1, wherein the block of uncoded data represents a compound object.

3. The encoding method of claim 1, wherein the block of uncoded data represents a multi-dimensional data object.

4. A decoding method, comprising:
   retrieving a plurality of bit markers from a memory;
   mapping bit markers in the plurality of bit markers to respective data vectors;
   combining the respective data vectors with a block of uncoded data to produce a composite uncoded data block; and
   combining the composite uncoded data block with default data to produce the decoded data.

5. The decoding method of claim 4, wherein the decoded data represents a compound object.

6. The decoding method of claim 4, wherein the decoded data represents a multi-dimensional data object.

7. A system to encode data, comprising:
   a data interface to receive a block of uncoded data; and
   a processor coupled to a memory, the processor configured:
      to decompose the block of uncoded data into a plurality of data vectors;
      to derive a plurality of bit markers from a characteristic of the uncoded data;
      to map each of the plurality of data vectors to one of the plurality of bit markers; and
      to store the plurality of bit markers in the memory to produce an encoded representation of the uncoded data.

8. The system of claim 7, wherein the block of uncoded data represents a compound object.

9. The system of claim 7, wherein the block of uncoded data represents a multi-dimensional data object.

10. The system of claim 7, wherein the bit marker comprises a seed value and a replication rule.

11. The system of claim 7, wherein the bit marker comprises plurality of other bit markers and a combination rule.

12. The system of claim 7, wherein said data vector comprises a fractalized pattern.

13. The system of claim 7, wherein the block of uncoded data represents a compound object.

14. The system of claim 7, wherein the block of uncoded data represents a multi-dimensional data object.

15. The system of claim 7, wherein the bit marker comprises a seed value and a replication rule.

16. The system of claim 7, wherein the bit marker comprises plurality of other bit markers and a combination rule.

17. The system of claim 7, wherein said data vector comprises a fractalized pattern.

18. The system of claim 7, wherein the block of uncoded data represents a compound object.

19. The system of claim 7, wherein the block of uncoded data represents a multi-dimensional data object.

20. The system of claim 7, wherein the bit marker comprises a seed value and a replication rule.

21. The system of claim 7, wherein the bit marker comprises plurality of other bit markers and a combination rule.

22. The system of claim 7, wherein said data vector comprises a fractalized pattern.

23. A system to decode data comprising:
   a data interface to retrieve a plurality of bit markers from a memory; and
   a processor coupled to a memory, the processor configured:
      to map bit markers in the plurality of bit markers to respective data vectors;
      to combine the respective data vectors with a block of uncoded data to produce a composite uncoded data block; and
      to produce the uncoded composite data block as the decoded data,
   wherein the bit marker comprises plurality of other bit markers and a combination rule.

24. An encoding method, comprising:
   receiving a block of uncoded data;
   decomposing the block of uncoded data into default data and non-default data;
   mapping the non-default data to a plurality of data vectors;
   mapping each of the plurality of data vectors to a respective bit marker; and
   storing the bit marker in a memory to produce an encoded representation of the uncoded data.

25. The encoding method of claim 24, wherein the block of uncoded data represents a compound object.

26. The encoding method of claim 24, wherein the block of uncoded data represents a multi-dimensional data object.

27. An encoding method, comprising:
receiving a block of uncoded data;
decomposing the block of uncoded data into a plurality of data vectors;
mapping each of the plurality of data vectors to a respective bit marker; and
storing the bit marker in a memory to produce an encoded representation of the uncoded data,
wherein at least some of the plurality of data vectors overlap one another when representing the block of uncoded data.

28. The encoding method of claim 27, wherein the block of uncoded data represents a compound object.

29. The encoding method of claim 27, wherein the block of uncoded data represents a multi-dimensional data object.

30. An encoding method, comprising:
receiving a block of uncoded data;
decomposing the block of uncoded data into a plurality of data vectors;
mapping each of the plurality of data vectors to a respective bit marker; and
storing the bit marker in a memory to produce an encoded representation of the uncoded data,
wherein the bit marker comprises a seed value and a replication rule.

31. The encoding method of claim 30, wherein the block of uncoded data represents a compound object.

32. The encoding method of claim 30, wherein the block of uncoded data represents a multi-dimensional data object.

33. An encoding method, comprising:
receiving a block of uncoded data;
decomposing the block of uncoded data into a plurality of data vectors;
mapping each of the plurality of data vectors to a respective bit marker; and
storing the bit marker in a memory to produce an encoded representation of the uncoded data,
wherein the bit marker comprises plurality of other bit markers and a combination rule.

34. The encoding method of claim 33, wherein the block of uncoded data represents a compound object.

35. The encoding method of claim 33, wherein the block of uncoded data represents a multi-dimensional data object.

36. An encoding method, comprising:
receiving a block of uncoded data;
decomposing the block of uncoded data into a plurality of data vectors;
mapping each of the plurality of data vectors to a respective bit marker; and
storing the bit marker in a memory to produce an encoded representation of the uncoded data,
wherein said data vector comprises a fractalized pattern.

37. The encoding method of claim 36, wherein the block of uncoded data represents a compound object.

38. The encoding method of claim 36, wherein the block of uncoded data represents a multi-dimensional data object.

39. A decoding method, comprising:
retrieving a plurality of bit markers from a memory;
mapping bit markers in the plurality of bit markers to respective data vectors;
combining the respective data vectors with a block of uncoded data to produce a composite uncoded data block; and
producing the uncoded composite data block as the decoded data,
wherein at least some of the plurality of data vectors overlap one another when forming the decoded data.

40. The decoding method of claim 39, wherein the decoded data represents a compound object.

41. The decoding method of claim 39, wherein the decoded data represents a multi-dimensional data object.

42. A decoding method, comprising:
retrieving a plurality of bit markers from a memory;
mapping bit markers in the plurality of bit markers to respective data vectors;
combining the respective data vectors with a block of uncoded data to produce a composite uncoded data block; and
producing the uncoded composite data block as the decoded data,
wherein a bit marker comprises a seed value and a replication rule.

43. The decoding method of claim 42, wherein the decoded data represents a compound object.

44. The decoding method of claim 42, wherein the decoded data represents a multi-dimensional data object.

45. A decoding method, comprising:
retrieving a plurality of bit markers from a memory;
mapping bit markers in the plurality of bit markers to respective data vectors;
combining the respective data vectors with a block of uncoded data to produce a composite uncoded data block; and
producing the uncoded composite data block as the decoded data,
wherein a bit marker comprises a plurality of other bit markers and a combination rule.

46. The decoding method of claim 45, wherein the decoded data represents a compound object.

47. The decoding method of claim 45, wherein the decoded data represents a multi-dimensional data object.

48. A decoding method, comprising:
retrieving a plurality of bit markers from a memory;
mapping bit markers in the plurality of bit markers to respective data vectors;
combining the respective data vectors with a block of uncoded data to produce a composite uncoded data block; and
producing the uncoded composite data block as the decoded data,
wherein said data vector comprises a fractalized pattern.

49. The decoding method of claim 48, wherein the decoded data represents a compound object.

50. The decoding method of claim 48, wherein the decoded data represents a multi-dimensional data object.

51. A system to encode data, comprising:
a data interface to receive a block of uncoded data; and
a processor coupled to a memory, the processor configured:
to decompose the block of uncoded data into default data and non-default data;
to map the non-default data to a plurality of data vectors;
to map each of the plurality of data vectors to a respective bit marker; and
to store the respective bit marker in the memory to produce an encoded representation of the uncoded data.

52. A system to encode data, comprising:
a data interface to receive a block of uncoded data; and
a processor coupled to a memory, the processor configured:
to decompose the block of uncoded data into a plurality of data vectors;
to map each of the plurality of data vectors to a respective bit marker; and to store the respective bit marker in the memory to produce an encoded representation of the uncoded data,
wherein at least some of the plurality of data vectors overlap one another when representing the block of uncoded data.

53. A system to decode data comprising:
a data interface to retrieve a plurality of bit markers from a memory; and
a processor coupled to a memory, the processor configured:
   to map bit markers in the plurality of bit markers to respective data vectors;
   to combine the respective data vectors with a block of uncoded data to produce a composite uncoded data block; and
   to produce the uncoded composite data block as the decoded data,
   wherein said data vector comprises a fractalized pattern.

54. A system to decode data comprising:
a data interface to retrieve a plurality of bit markers from a memory; and
a processor coupled to a memory, the processor configured:
   to map bit markers in the plurality of bit markers to respective data vectors;
   to combine the respective data vectors with a block of uncoded data to produce a composite uncoded data block; and
   to produce the uncoded composite data block as the decoded data,
   wherein at least some of the plurality of data vectors overlap one another when forming the decoded data.

* * * * *

UNITED STATES PATENT AND TRADEMARK OFFICE
CERTIFICATE OF CORRECTION

| | | |
|---|---|---|
| PATENT NO. | : 9,304,703 B1 | Page 1 of 1 |
| APPLICATION NO. | : 14/804175 | |
| DATED | : April 5, 2016 | |
| INVENTOR(S) | : Brian M. Ignomirello | |

It is certified that error appears in the above-identified patent and that said Letters Patent is hereby corrected as shown below:

Specification

Column 1, line 45, background: "computers" should read -- computer's --,

Column 2, line 22, "compute system, the memory losses" should read -- computer system, the memory loses --, Column 7, line 59, "pay" should read -- may --.

Signed and Sealed this
Seventh Day of June, 2016

Michelle K. Lee
*Director of the United States Patent and Trademark Office*